US009766292B2

(12) United States Patent
Hirose et al.

(10) Patent No.: US 9,766,292 B2
(45) Date of Patent: Sep. 19, 2017

(54) ABNORMALITY DIAGNOSTIC DEVICE AND ABNORMALITY DIAGNOSTIC METHOD FOR MOSFET SWITCH ELEMENT

(71) Applicant: KABUSHIKI KAISHA TOYOTA JIDOSHOKKI, Kariya-shi, Aichi (JP)

(72) Inventors: Shinji Hirose, Kariya (JP); Mamoru Kuraishi, Kariya (JP); Tomoyuki Ito, Kariya (JP); Kazuhiro Niimura, Kariya (JP); Kenji Nishigaki, Kariya (JP); Junichi Hatano, Kariya (JP); Satoshi Yamamoto, Kariya (JP); Yusuke Tsutsui, Kariya (JP)

(73) Assignee: KABUSHIKI KAISHA TOYOTA JIDOSHOKKI, Kariya-shi, Aichi (JP)

( * ) Notice: Subject to any disclaimer, the term of this patent is extended or adjusted under 35 U.S.C. 154(b) by 24 days.

(21) Appl. No.: 15/021,582

(22) PCT Filed: Jun. 30, 2014

(86) PCT No.: PCT/JP2014/067341
§ 371 (c)(1),
(2) Date: Mar. 11, 2016

(87) PCT Pub. No.: WO2015/040923
PCT Pub. Date: Mar. 26, 2015

(65) Prior Publication Data
US 2016/0231382 A1 Aug. 11, 2016

(30) Foreign Application Priority Data

Sep. 19, 2013 (JP) .................................. 2013-193594
Mar. 17, 2014 (JP) .................................. 2014-053305

(51) Int. Cl.
*H02J 7/00* (2006.01)
*G01R 31/327* (2006.01)
(Continued)

(52) U.S. Cl.
CPC ....... *G01R 31/3278* (2013.01); *G01R 31/025* (2013.01); *G01R 31/3277* (2013.01);
(Continued)

(58) Field of Classification Search
CPC combination set(s) only.
See application file for complete search history.

(56) References Cited

U.S. PATENT DOCUMENTS 7,642,750 B2 * 1/2010 Liu .................. H02J 7/0068
320/127
2007/0188141 A1 8/2007 Hamaguchi et al.
2011/0121780 A1 5/2011 Fukuo et al.

FOREIGN PATENT DOCUMENTS

JP 9-322421 A 12/1997
JP 2004-343850 A 12/2004
(Continued)

OTHER PUBLICATIONS

Communication dated Sep. 1, 2016 from the European Patent Office in counterpart application No. 14846577.6.
(Continued)

Primary Examiner — Minh Phan
(74) Attorney, Agent, or Firm — Sughrue Mion, PLLC

(57) ABSTRACT

An abnormality diagnostic for a MOSFET switch element in a rechargeable battery pack for determining a short circuit abnormality (fusion) in a MOSFET switch element that causes a charge current to flow in. An on/off controller turns off a MOSFET causing a charge current to flow into a battery module, a start-of-charge instruction unit transmits to a charger an instruction signal to start a charging operation, and a short circuit abnormality diagnostic unit determines, based on a current sensor output, whether current is flowing through the MOSFET due to the charging operation to diagnose a short circuit abnormality in the MOSFET. After diagnosis of the MOSFET, a diagnosis of a short circuit
(Continued)

abnormality in a MOSFET that causes a discharge current to flow out of the battery module is performed, and then a diagnosis of a short circuit abnormality in a charge relay is performed.

4 Claims, 7 Drawing Sheets

(51) Int. Cl.
*G01R 31/02* (2006.01)
*H01M 10/48* (2006.01)
*H03K 17/082* (2006.01)
*H02H 3/087* (2006.01)
*H02H 7/18* (2006.01)

(52) U.S. Cl.
CPC .......... *H01M 10/482* (2013.01); *H02H 3/087* (2013.01); *H02H 7/18* (2013.01); *H02J 7/0029* (2013.01); *H02J 7/0068* (2013.01); *H03K 17/0822* (2013.01); *H02J 7/0047* (2013.01)

(56) References Cited

FOREIGN PATENT DOCUMENTS

| | | |
|---|---|---|
| JP | 2011-109872 A | 6/2011 |
| JP | 2012-100438 A | 5/2012 |
| JP | 2013-172632 A | 9/2013 |

OTHER PUBLICATIONS

International Search Report for PCT/JP2014/067341 dated Aug. 19, 2014.

* cited by examiner

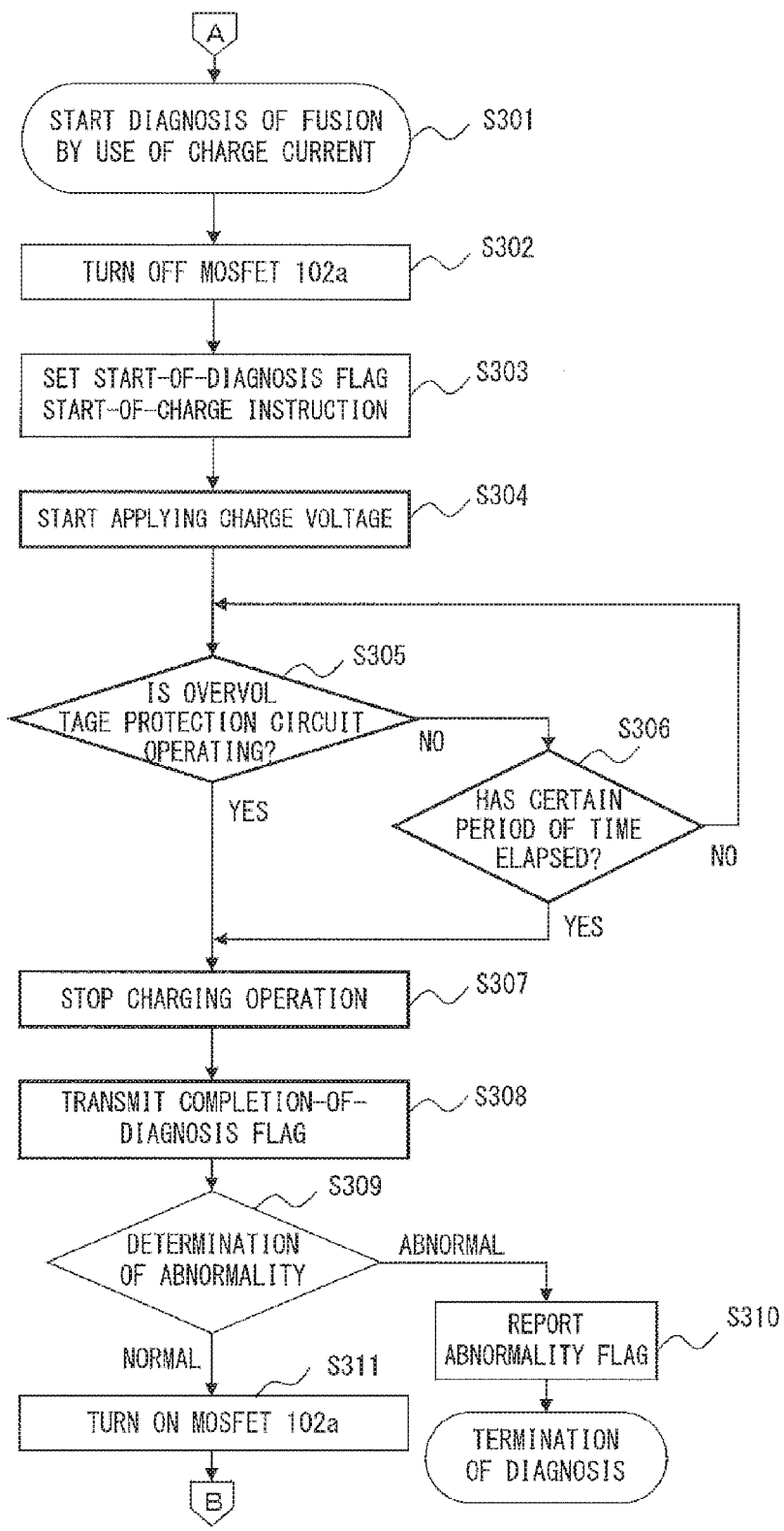
F I G. 3

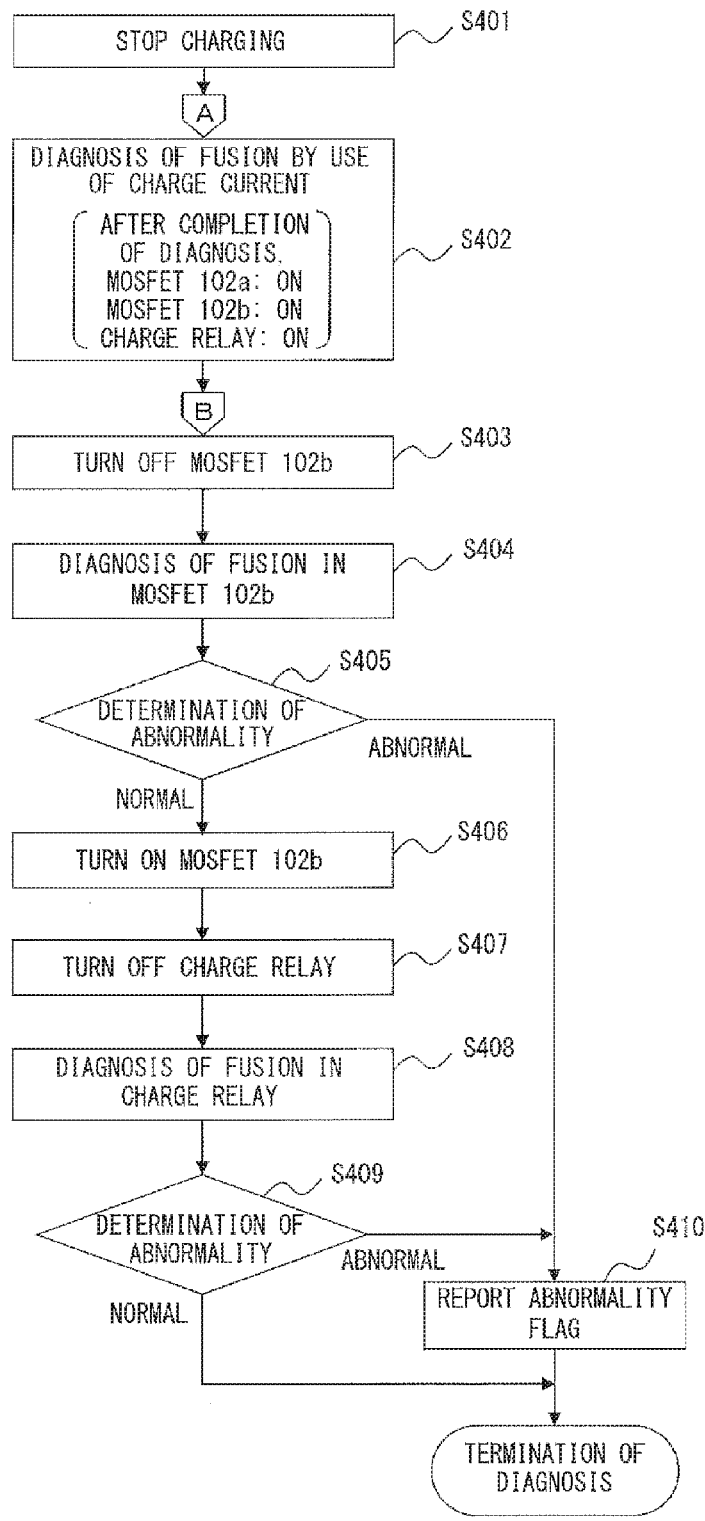
F I G. 4

ABNORMALITY DIAGNOSTIC DEVICE AND ABNORMALITY DIAGNOSTIC METHOD FOR MOSFET SWITCH ELEMENT

CROSS REFERENCE TO RELATED APPLICATIONS

This application is a National Stage of International Application No. PCT/JP2014/067341 filed Jun. 30, 2014, claiming priority based on Japanese Patent Application Nos. 2013-193594 filed Sep. 19, 2013, and 2014-053305 filed Mar. 17, 2014, the contents of all of which are incorporated herein by reference in their entirety.

TECHNICAL FIELD

The present invention relates to an abnormality diagnostic device and an abnormality diagnostic method for a MOSFET (metal-oxide-semiconductor field-effect transistor) switch element included in a rechargeable battery pack, in particular, for diagnosing a short circuit abnormality (fusion) that is a state in which a MOSFET switch element remains on (short circuited) even if the MOSFET switch element is controlled to be off.

RELATED ART

FIG. 7 illustrates an example of a battery pack used for, for example, an electric vehicle that is driven by a rechargeable battery. A battery pack 100 includes one or more battery modules 101, and the battery module 101 includes one or more rechargeable batteries, a sensor that monitors states of the batteries, and a battery monitoring unit (not shown).

The battery module 101 is connected to a charger 200 through positive and negative feed lines 103a and 103b, a charge relay 104, and a charger-side connector 201, and is charged by the charger 200. Further, the battery module 101 is disconnected from the charger 200 after the charging is completed, and supplies current to a load 300 of, for example, a motor through the feed lines 103a and 103b and a main switch 301.

In order to protect against an abnormality due to, for example, overcharging or overdischarging, for each battery module 101, first and second MOSFET switch elements 102a and 102b that interrupt a charge current flowing into a battery or a discharge current flowing out of the battery are provided in series between one of the feed lines 103a and 103b and each of the battery modules 101.

FIG. 7 illustrates an exemplary configuration in which the first and second MOSFET switch elements 102a and 102b are provided on the side of the negative feed line 103b, but the first and second MOSFET switch elements 102a and 102b may be provided on the side of the positive feed line 103a. However, in order to simplify the description, the exemplary configuration in which the first and second MOSFET switch elements 102a and 102b are provided on the side of the negative feed line 103b will be described below, but it is also operable with an exemplary configuration in which they are provided on the side of the positive feed line 103a.

A holding current flowing through the first and second MOSFET switch elements 102a and 102b that are made of a semiconductor is lower than that of a mechanical relay, and in the first and second MOSFET switch elements 102a and 102b, the degradation of the conduction/interruption characteristics due to, for example, an abrasion or fusion of a contact is small, but there coexists a parasitic diode between a source and a drain.

Further, a charge current and a discharge current each flow through the battery module 101 in opposite directions, so the first and second MOSFET switch elements 102a and 102b that are connected to each other in series in opposite directions are provided in order to turn on/off the two-way currents. The MOSFET switch element is hereinafter simply referred to as a MOSFET.

The first MOSFET 102a causes a charge current to flow into the battery module 101 when it is on. When the first MOSFET 102a is turned on, a charge current flows into the battery module 101 through a parasitic diode of the second MOSFET 102b, regardless of whether the second MOSFET 102b is on or off.

On the other hand, when the first MOSFET 102a is turned off, a charge current is not allowed to flow into the battery module 101, regardless of whether the second MOSFET 102b is on or off, because the direction of a parasitic diode of the first MOSFET 102a is opposite to that of the charge current.

Further, the second MOSFET 102b causes a discharge current to flow out of the battery module 101 when it is on. When the second MOSFET 102b is turned on, a discharge current flows out of the battery module 101 through the parasitic diode of the first MOSFET 102a, regardless of whether the first MOSFET 102a is on or off.

On the other hand, when the second MOSFET 102b is turned off, a discharge current is not allowed to flow out of the battery module 101, regardless of whether the first MOSFET 102a is on or off, because the direction of the parasitic diode of the second MOSFET 102b is opposite to that of the discharge current.

In switch elements such as the first and second MOSFET 102a and 102b and the charge relay 104, there may occur a short circuit abnormality (fusion) in which a switch element remains in a short-circuited (on) state even if it is controlled to be off such that a current path is interrupted, so a frequent diagnosis of a short circuit abnormality (fusion) is required to be performed on these switch elements.

In order to diagnose a short circuit abnormality (fusion) in the charge relay 104, for example, a discharging circuit 106 that is constituted of, for example, a transistor switch and resistance is provided in a control unit 105 in the battery pack 100, and the discharging circuit 106 is connected such that a closed circuit is formed in the order of "battery module 101→positive feed line 103a→discharging circuit 106→charge relay 104→negative feed line 103b→second MOSFET 102b→first MOSFET 102a→battery module 101".

Then, an on/off controller 107 in the control unit 105 determines whether a discharge current is flowing through the discharging circuit 106 in a state in which the charge relay 104 is off and the second MOSFET 102b is on. It is determined that a short circuit abnormality (fusion) has occurred in the charge relay 104 when it is determined that a discharge current has flowed through the discharging circuit 106, and it is determined that a short circuit abnormality (fusion) has not occurred in the charge relay 104 when it is determined that a discharge current has not flowed.

Further, a short circuit abnormality (fusion) in the second MOSFET 102b is diagnosed by use of the discharging circuit 106 described above. For the diagnosis of a short circuit abnormality (fusion) in the second MOSFET 102b, the on/off controller 107 in the control unit 105 determines whether a discharge current is flowing through the discharging circuit 106 in a state in which the charge relay 104 is on and the second MOSFET 102b is off.

It is determined that a short circuit abnormality (fusion) has occurred in the second MOSFET 102b when it is determined that a discharge current has flowed through the discharging circuit 106, and it is determined that a short circuit abnormality (fusion) has not occurred in the second MOSFET 102b when it is determined that a discharge current has not flowed.

Patent Document 1 below discloses a method for diagnosing a short circuit abnormality (fusion) in a relay that is turned on when charging is allowed to be performed, the method including controlling the relay to be off when the diagnosis is performed, measuring voltage on one of the contact sides of the relay and voltage on the other contact side of the relay, and diagnosing fusion in the relay on the basis of these voltages.

CITATION LIST

Patent Document

Patent Document 1: Japanese Laid-open Patent Publication No. 2011-109872

SUMMARY OF INVENTION

Technical Problem

As described above, it is possible to diagnose a short circuit abnormality (fusion) in the charge relay 104 and the second MOSFET 102b in the battery pack 100 by determining whether a discharge current is flowing through the discharging circuit 106 included in the battery pack 100, wherein the second MOSFET 102b is a switch element that causes a discharge current to flow out.

However, it is not possible to diagnose a short circuit abnormality (fusion) in the first MOSFET 102a by use of, for example, the discharging circuit 106 included in the battery pack, wherein the first MOSFET 102a is a switch element that is another switch element connected to the battery module 101 and that causes a charge current to flow in. The reason is that, even if the first MOSFET 102a is controlled to be off in a state in which the charge relay 104 and the second MOSFET 102b are on, a discharge current flows into the discharging circuit 106 through the parasitic diode of the first MOSFET 102a, regardless of whether there exists a short circuit abnormality (fusion).

In light of the problem described above, an object of the present invention is to provide an abnormality diagnostic device and method for diagnosing an abnormality in a MOSFET switch element, the abnormality diagnostic device and method permitting a diagnosis of the occurrence of a short circuit abnormality (fusion) in a first MOSFET 102a that is connected to the battery module 101 in the battery pack 100 and that causes a charge current to flow in.

Solution to Problem

An abnormality diagnostic device for diagnosing an abnormality in a MOSFET switch element according to an aspect of the present invention includes a current sensor detecting current that flows through a battery module, and a control unit that turns off a MOSFET switch element that causes a charge current to flow into the battery module, transmits, to a charger that charges the battery module, an instruction signal to start a charging operation, and determines, on the basis of an output signal of the current sensor, whether current is flowing through the MOSFET switch element due to the charging operation of the charger, so as to diagnose a short circuit abnormality in the MOSFET switch element on the basis of a result of the determination.

Further, in a battery pack in which a first MOSFET switch element that is the MOSFET switch element that causes the charge current to flow into and a second MOSFET switch element that is a MOSFET switch element that causes a discharge current to flow out of the battery module are connected to the battery module in series, the control unit diagnoses a short circuit abnormality in the first MOSFET switch element after the charging of the battery module performed by the charger is completed and turns off the second MOSFET switch element after the diagnosis, or before the diagnosis and after the charging is completed, and determines whether a discharge current is flowing through the second MOSFET switch element, so as to diagnose a short circuit abnormality in the second MOSFET switch element.

Furthermore, in the battery pack in which a charge relay is further provided in a current path through which a charge current flows from the charger to the battery module, the control unit diagnoses, after the charging of the battery module performed by the charger is completed, a short circuit abnormality in the first MOSFET switch element and a short circuit abnormality in the second MOSFET switch element in a state in which the charge relay is on, turns off, after that, the charge relay in a state in which the first MOSFET switch element and the second MOSFET switch element are on, and determines whether a discharge current is flowing through the charge relay, so as to diagnose a short circuit abnormality in the charge relay.

Moreover, in a battery pack in which a first MOSFET switch element that is the MOSFET switch element that causes a charge current to flow into and a second MOSFET switch element that is a MOSFET switch element that causes a discharge current to flow out of the battery module are connected to the battery module in series, the control unit diagnoses a short circuit abnormality in the first MOSFET switch element before the charging of the battery module performed by the charger is started and turns off the second MOSFET switch element before the diagnosis, or after the diagnosis and before the charging is started, and determines whether a discharge current is flowing through the second MOSFET switch element, so as to diagnose a short circuit abnormality in the second MOSFET switch element.

Further, in the battery pack in which a charge relay is further provided in a current path through which a charge current flows from the charger to the battery module, the control unit determines, before the charging of the battery module performed by the charger is started, whether a discharge current is flowing through the charge relay in a state in which the charge relay is off, so as to diagnose a short circuit abnormality in the charge relay, and diagnoses, after that, a short circuit abnormality in the first MOSFET switch element and a short circuit abnormality in the second MOSFET switch element in a state in which the charge relay is on.

Advantageous Effects of Invention

According to embodiments of the present invention, it is possible to diagnose a short circuit abnormality (fusion) in a MOSFET that is connected to a battery module and that causes a charge current to flow in without an increase in cost, by causing a charger that charges a battery module in the battery pack to supply a charging current and by determining whether there exists a charge current that is flowing at that time.

Further, if, after charging is completed, a diagnosis of a short circuit abnormality (fusion) in a first MOSFET switch element and a second MOSFET switch element that are connected to a battery module is performed, and then a diagnosis of a short circuit abnormality (fusion) in a charge relay is performed, the number of on/off switching controls of each of the switch elements for performing a diagnosis is minimal, which results in efficiently diagnosing a short circuit abnormality (fusion) in these switch elements.

Furthermore, if, before charging is started, a diagnosis of a short circuit abnormality (fusion) in a charge relay is performed, and then a diagnosis of a short circuit abnormality (fusion) in a first MOSFET switch element and a second MOSFET switch element that are connected to a battery module is performed, the number of on/off switching controls of each of the switch elements for performing a diagnosis is minimal, which results in efficiently diagnosing a short circuit abnormality (fusion) in these switch elements.

BRIEF DESCRIPTION OF DRAWINGS

FIG. 1 is a diagram that illustrates an example of an abnormality diagnostic device that diagnoses a short circuit abnormality in a switch element including a MOSFET that causes a charge current to flow in;

FIG. 2 illustrates charge voltage waveforms and charge current waveforms when performing a diagnosis of the MOSFET that causes a charge current to flow in;

FIG. 3 illustrates a flowchart of a MOSFET diagnosis by use of a charge current;

FIG. 4 is a first flowchart for performing a diagnosis of each switch element by use of a charge current and a discharge current;

DESCRIPTION OF EMBODIMENTS

Figure 1:
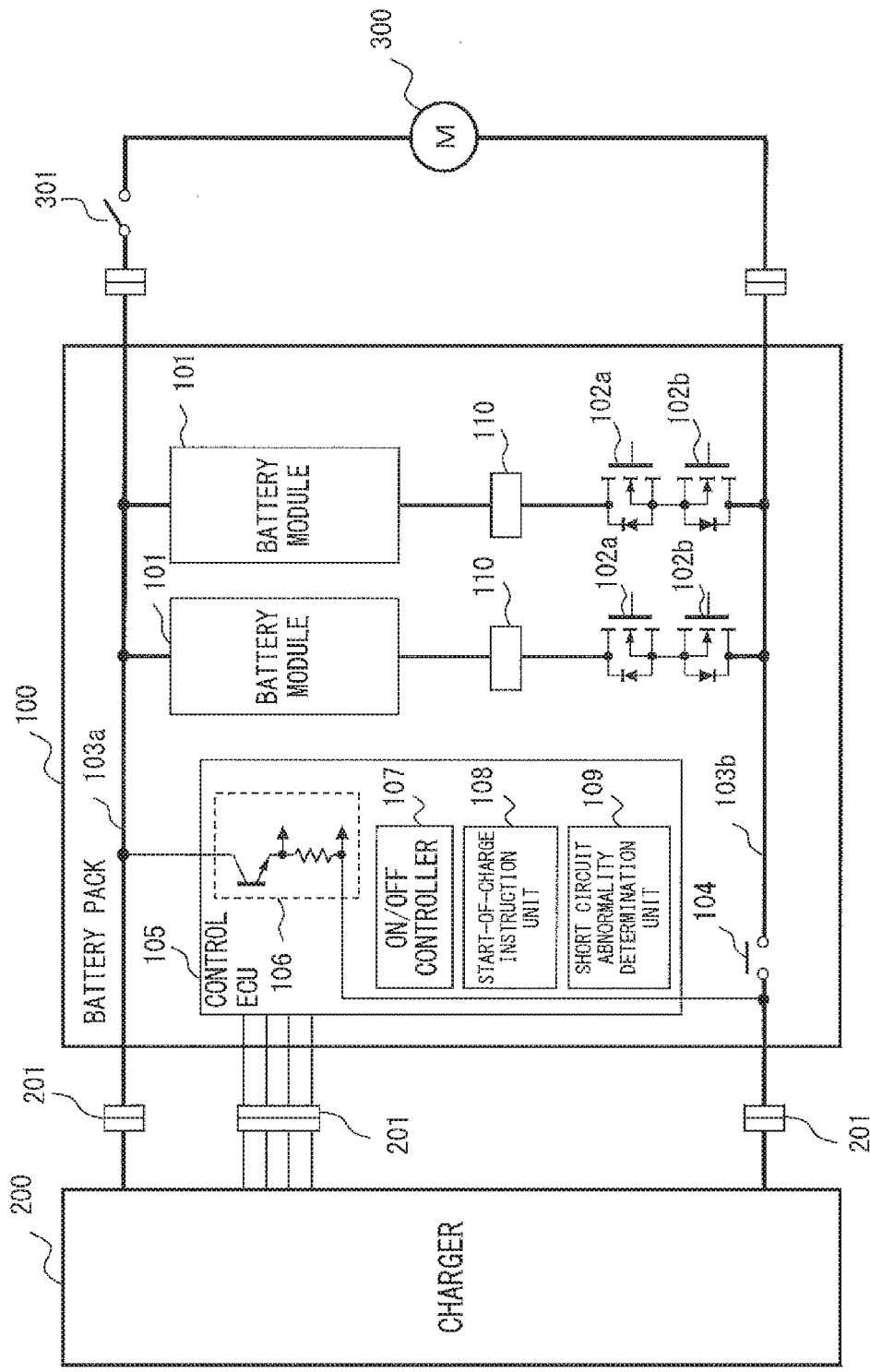

Embodiments of the present invention will now be described with reference to the drawings. FIG. 1 is a diagram that illustrates an example of an abnormality diagnostic device according to the present embodiment. In the present embodiment, a battery pack 100 includes a current sensor 110 that detects a charge current and a discharge current that flow through a battery module 101, an on/off controller 107 that performs an on/off control on MOSFETs 102a and 102b and a charge relay 104, a start-of-charge instruction unit 108 that transmits, to a charger 200 that charges the battery module 101, an instruction signal to start a charging operation, and a short circuit abnormality diagnostic unit 109 that determines, on the basis of an output signal of the current sensor 110, whether a charge current is flowing through the MOSFET 102a due to the charging operation of the charger 200, so as to diagnose a short circuit abnormality in the MOSFET 102a on the basis of a result of the determination, or that determines, on the basis of an output signal of the current sensor 110, whether a discharge current is flowing through the MOSFET 102b or the charge relay 104 by a discharging operation of a discharging circuit 106, so as to diagnose a short circuit abnormality in the MOSFET 102b or the charge relay 104 on the basis of a result of the determination.

Figure 2:
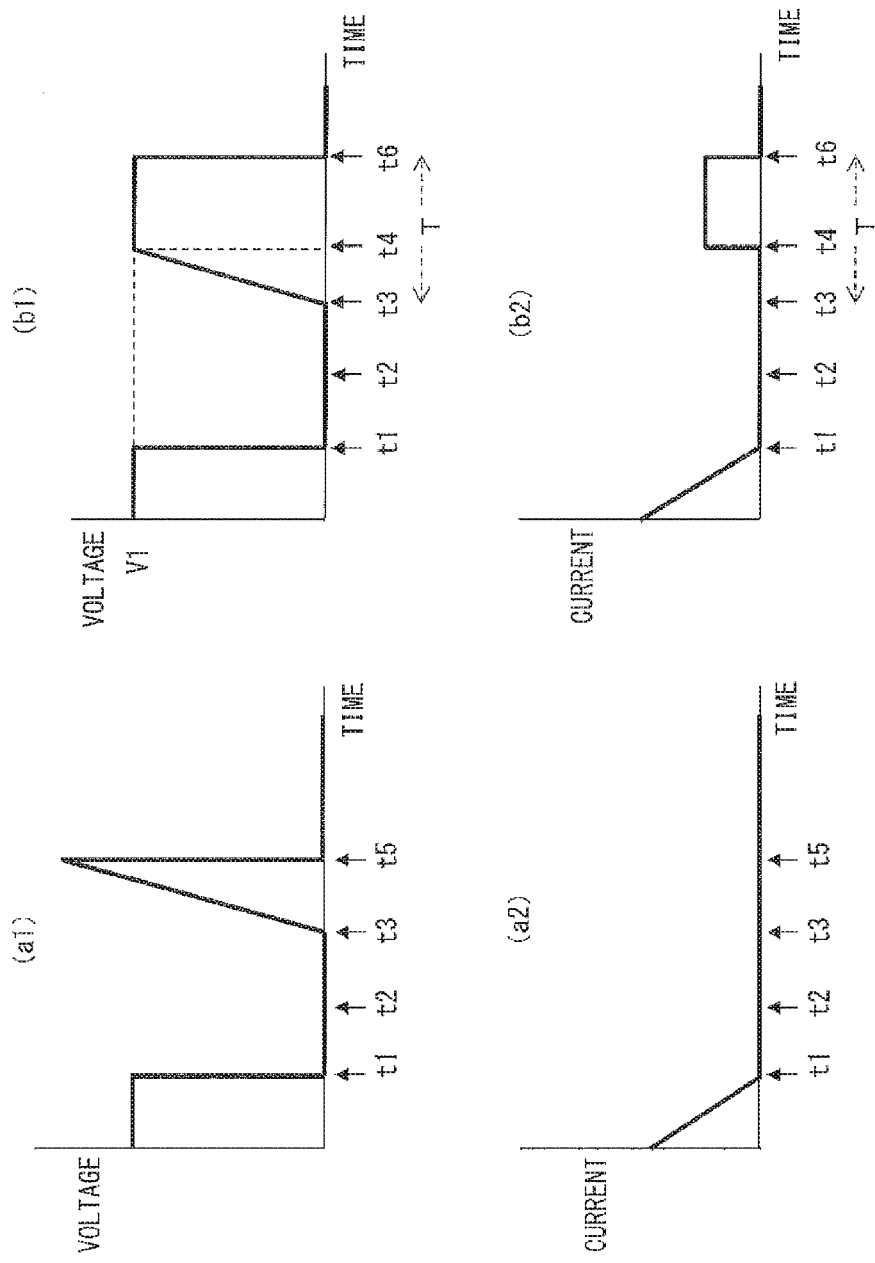

An operation of the abnormality diagnostic device according to the present embodiment will be described with reference to FIGS. 2 to 6. FIG. 2 illustrates charge voltage waveforms and charge current waveforms when performing a diagnosis of the MOSFET 102a that causes a charge current to flow in. (a1) and (a2) of FIG. 2 respectively represent waveforms of an output voltage and a charge current of the charger 200 when the MOSFET 102a is in a normal state (without fusion). (b1) and (b2) of FIG. 2 respectively represent waveforms of an output voltage and a charge current of the charger 200 when there exists a short circuit abnormality in the MOSFET 102a (with fusion).

When the battery pack 100 is charged by the charger 200, as illustrated in FIG. 2, the charging is completed at time t1, the MOSFET 102a is turned off at time t2, and then an instruction is issued to the charger 200 to start a charging operation at time t3, so as to cause the charger 200 to output a charge voltage.

When the MOSFET 102a is in a normal state (without fusion), a charge current does not flow as indicated in (a2) of FIG. 2, so the charger 200 increases an output voltage as indicated in (a1) of FIG. 2 such that a predetermined charge current flows. As a result, an overvoltage protection circuit of the charger 200 operates at time t5, and stops the charging operation.

On the other hand, when there exists a short circuit abnormality in the MOSFET 102a (with fusion), an instruction is issued to the charger 200 to start a charging operation at time t3, so as to cause the charger 200 to output a charge voltage, a charge current starts flowing through the MOSFET 102a at time t4 at which the charge voltage has reached a battery voltage V1, as indicated in (b2) of FIG. 2, and the output voltage of the charger 200 does not increase only up to the battery voltage V1 as illustrated in (b1) of FIG. 2, with the result that the overvoltage protection circuit does not operate.

The charger 200 stops the charging operation at time t6 at which a certain period of time T has elapsed since time t3. It is determined, on the basis of a result of a detection performed by the current sensor 110, whether a charge current is flowing through the MOSFET 102a during the certain period of time T from time t3 to time t6, and it is determined that there exists a short circuit abnormality (fusion) when a charge current has flowed, and that there does not exist a short circuit abnormality (without fusion) when a charge current has not flowed.

FIG. 3 illustrates an operational flow for diagnosing a short circuit abnormality (fusion) in the MOSFET 102a by use of a charge current. In FIG. 3, an operation with a thick-lined border is an operation in the charger 200, and an operation with a thin-lined border is an operation in the battery pack 100.

When starting a diagnosis of a short circuit abnormality (fusion) by use of a charge current in a state in which the battery pack 100 is connected to the charger 200 and the charge relay 104 is on (Step S301), the on/off controller 107 of the battery pack 100 controls the MOSFET 102a that causes a charge current to flow in to be off (Step S302).

Next, the start-of-charge instruction unit 108 of the battery pack 100 sets a start-of-diagnosis flag that indicates that a diagnosis of a short circuit abnormality in the MOSFET 102a is started, and instructs the charger 200 to charge the battery pack 100 at a predetermined charge current rate for a certain period of time to diagnose a short circuit abnormality in the MOSFET 102a (Step S303).

When receiving, from a control unit 105 of the battery pack 100, an instruction signal to start charging at the predetermined current rate for diagnosing a short circuit abnormality, the charger 200 starts applying a charge voltage to feed lines 103a and 103b of the battery pack 100 such that the battery pack 100 is charged at the predetermined current rate (Step S304).

The charger 200 gradually increases a charge voltage to be applied while monitoring a charge current, such that the battery pack 100 is charged at the predetermined current rate described above, and monitors whether the charge voltage reaches a predetermined threshold and an overvoltage protection circuit operates (Step S305).

When the overvoltage protection circuit operates (YES in Step S305), the charger 200 stops outputting the charge voltage to stop the charging operation (Step S307). On the other hand, when the overvoltage protection circuit does not operate (NO in Step S305), the charger 200 monitors whether a certain period of time has elapsed since the charging was started (Step S306).

When the certain period of time has not elapsed since the charging was started (NO in Step S306), the process returns to the operation of Step S305 for the charger 200. On the other hand, when the certain period of time has elapsed since the charging was started (YES in Step S306), the charger 200 stops outputting the charge voltage to stop the charging operation (Step S307).

After stopping the charging operation, the charger 200 transmits, to the battery pack 100, a completion-of-diagnosis flag that reports that the charging has been stopped (Step S308). When receiving the completion-of-diagnosis flag, the short circuit abnormality diagnostic unit 109 of the battery pack 100 determines whether there exists a short circuit abnormality (fusion) in the MOSFET 102a by determining whether a charge current is flowing (Step S309).

From when the start-of-diagnosis flag is set in Step S303 described above until the completion-of-diagnosis flag is received from the charger 200, the short circuit abnormality diagnostic unit 109 of the battery pack 100 monitors whether a charge current is flowing through the battery module 101 using the current sensor 110, and stores a result of the monitoring. In the determination of abnormality in Step S309, it is determined, on the basis of a result of the monitoring, that there exists a short circuit abnormality (fusion) in the MOSFET 102a when the fact that a charge current has flowed is stored.

When it is determined in Step S309 that there exists a short circuit abnormality (fusion), the short circuit abnormality diagnostic unit 109 of the battery pack 100 sets an abnormality flag reporting the short circuit abnormality (fusion) in the MOSFET 102a so as to report it to a user (Step S310), and terminates an operation for diagnosing a short circuit abnormality (fusion). On the other hand, when the fact that a charge current has flowed is not stored, it is determined that the MOSFET 102a is in a normal state (without fusion).

When the MOSFET 102a is determined to be in a normal state (without fusion) in Step S309, the on/off controller 107 turns on the MOSFET 102a (Step S311). When the diagnosis of a short circuit abnormality (fusion) in the MOSFET 102a that is performed by use of a charge current is terminated, all of the MOSFETs 102a and 102b and the charge relay 104 are terminated in an on state. Before or after this diagnosis, a diagnosis of a short circuit abnormality (fusion) in the MOSFETs 102b or the charge relay 104 is appropriately performed.

A series of operational flows for diagnosing a short circuit abnormality (fusion) in each switch element such as the MOSFETs 102a and 102b and the charge relay 104 will be described below with reference to FIGS. 4 to 6. FIG. 4 is a first operational flow for diagnosing a short circuit abnormality in each switch element by use of a charge current and a discharge current.

In the first operational flow, after the charging of the battery pack 100 is completed, a diagnosis is performed on the first and second MOSFETs 102a and 102b, and then on the charge relay 104. The battery pack 100 is connected to the charger 200 to be charged, and after the charging performed by the charger 200 is completed and the charging is stopped (Step S401), a diagnosis of a short circuit abnormality (fusion) in the MOSFET 102a by use of a charge current is performed (Step S402).

The diagnosis in Step S402 is the diagnosis performed on the MOSFET 102a in Steps S301 to S311 described in FIG. 3. When the diagnosis is completed, all of the MOSFETs 102a and 102b and the charge relay 104 are in an on state.

Next, the on/off controller 107 of the battery pack 100 turns off the MOSFET 102b (Step S403), a transistor in the discharging circuit 106 is turned on, and the short circuit abnormality diagnostic unit 109 diagnoses a short circuit abnormality (fusion) in the MOSFET 102b (Step S404).

The short circuit abnormality diagnostic unit 109 determines whether there exists a short circuit abnormality (fusion) in the MOSFET 102b by determining whether a discharge current is flowing through the discharging circuit 106 (Step S405). In the determination of abnormality in Step S405, it is determined that there exists a short circuit abnormality (fusion) in the MOSFET 102b when it is determined that a discharge current has flowed.

When it is determined in Step S405 that there exists an abnormality, the short circuit abnormality diagnostic unit 109 sets an abnormality flag reporting the short circuit abnormality (fusion) in the MOSFET 102b so as to report it to the user (Step S410), and terminates an operation for diagnosing an abnormality.

On the other hand, when it is determined that a discharge current has not flowed and the MOSFET 102b is determined to be in a normal state (without fusion) in Step S405, the on/off controller 107 turns on the MOSFET 102b (Step S406) and turns off the charge relay 104 (Step S407). Then, the transistor in the discharging circuit 106 is turned on, and the short circuit abnormality diagnostic unit 109 diagnoses a short circuit abnormality (fusion) in the charge relay 104 (Step S408).

The short circuit abnormality diagnostic unit 109 determines whether there exists a short circuit abnormality (fusion) in the charge relay 104 by determining whether a discharge current is flowing through the discharging circuit 106 (Step S409). In the determination of abnormality in Step S409, it is determined that there exists a short circuit abnormality (fusion) in the charge relay 104 when it is determined that a discharge current has flowed.

When in it determined in Step S409 that there exists an abnormality, the short circuit abnormality diagnostic unit 109 sets an abnormality flag reporting the short circuit abnormality (fusion) in the charge relay 104 so as to report it to the user (Step S410), and terminates an operation for diagnosing a short circuit abnormality (fusion). When it is determined in Step S409 that a discharge current has not flowed and the charge relay 104 is determined to be in a normal state, an operation for diagnosing a short circuit abnormality (fusion) is terminated.

In the first operational flow, after the charging of the battery module 101 is completed, in a state in which the charge relay 104 remains on, (1) first, a diagnosis of a short circuit abnormality (fusion) in the first MOSFET 102a is performed in a state in which the first MOSFET 102a is off, and the first MOSFET 102a is turned on after the diagnosis, and (2) next, a diagnosis of a short circuit abnormality (fusion) in the second MOSFET 102b is performed in a state in which the second MOSFET 102b is off, and the second MOSFET 102b is turned on after the diagnosis, and then, (3) finally, a diagnosis of a short circuit abnormality (fusion) in the charge relay 104 is performed in a state in which the charge relay 104 is off.

If a diagnosis is performed using these procedures, a diagnostic operation is completed in a state in which the first and second MOSFETs 102a and 102b are on and the charge relay 104 is off when the diagnoses of a short circuit abnormality (fusion) in the first and second MOSFETs 102a and 102b and in the charge relay 104 are completed. This is a state in which the battery pack 100 can be immediately used for supplying power to a load 300.

Thus, when diagnosing a short circuit abnormality (fusion) in each switch element such as the first and second MOSFETs 102a and 102b and the charge relay 104 after the charging performed by the charger 200 is completed, the number of on/off switching controls for diagnosing a short circuit abnormality (fusion) in each of the switch elements is minimal, which results in efficiently diagnosing a short circuit abnormality (fusion) in these switch elements.

In the first operational flow, even if the order of performing the diagnoses on the first MOSFET 102a and the second MOSFET 102b is changed, the number of on/off switching controls for diagnosing a short circuit abnormality (fusion) in each switch element remains unchanged.

Thus, "DIAGNOSIS OF FUSION BY USE OF CHARGE CURRENT (the diagnosis of the first MOSFET 102a)" of Step S402 may be performed next after "TURN ON MOSFET 102b" of Step S406 that is performed when the diagnosis of the second MOSFET 102b is completed, and before "TURN OFF CHARGE RELAY" of Step S407 that is performed before the diagnosis of the charge relay 104 is started.

In the first operational flow illustrated in FIG. 4 described above, a diagnosis is only performed after the charging of the battery pack 100 is completed. If a diagnosis is only performed after the charging of the battery pack 100 is completed, there is a possibility that a short circuit abnormality (fusion) in each switch element will not be detected when the charging is not completed in a normal way.

As an example, when the charging is stopped by pulling out a charger-side connector 201, with the result that the charger 200 and the battery pack 100 are separated from each other, or when the charging is stopped by the user pushing an emergency stop button down, with the result that a power circuit of the charger 200 powers down, the charging of the battery pack 100 is not completed in a normal way.

Further, if a diagnosis of a short circuit abnormality (fusion) in each switch element is only performed after the charging of the battery pack 100 is completed, when a short circuit abnormality (fusion) occurs in any switch element, for example while a vehicle equipped with the battery pack 100 after being charged is moving, a next charging is performed without the short circuit abnormality (fusion) being detected when the charging is started, and the short circuit abnormality (fusion) is first detected after the next charging is completed.

Thus, there may occur a problem in which, after the charging of the battery pack 100 is started, the first MOSFET 102a cannot be turned off due to the occurrence of a short circuit abnormality (fusion) when an abnormality occurs during the charging and the first MOSFET 102a needs to be turned off.

Figure 5:
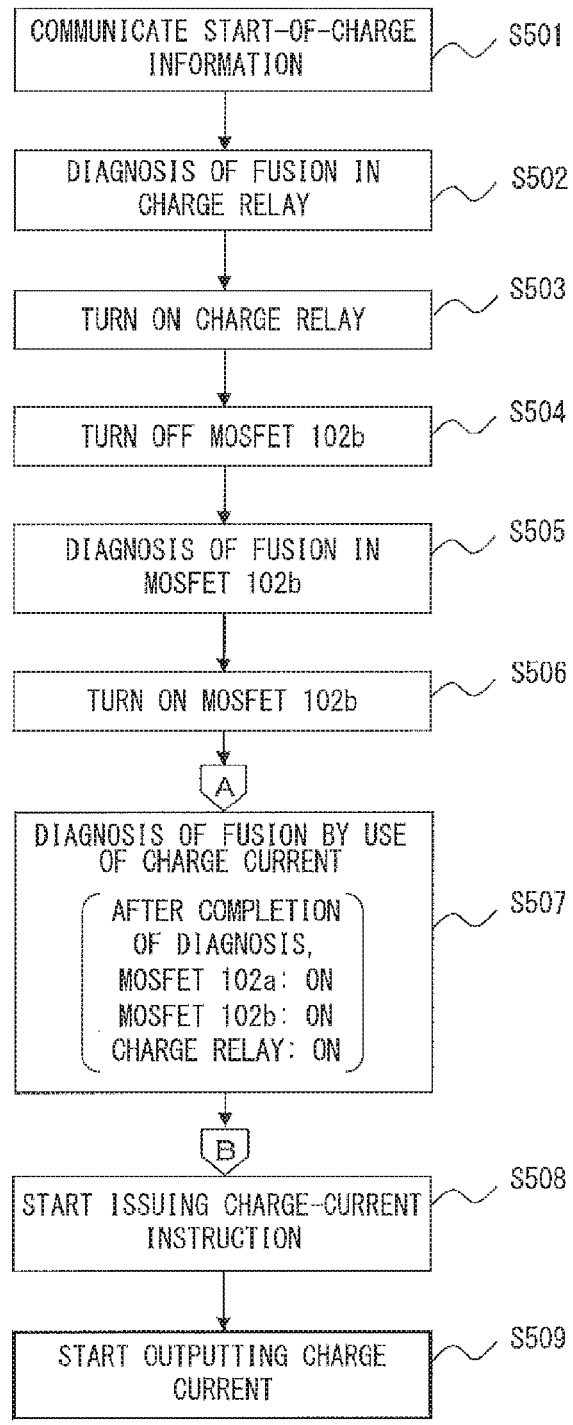
FIG. 5 is a second flowchart for performing a diagnosis of each switch element by use of a charge current and a discharge current.

Thus, as illustrated in FIG. 5 as a second operational flow, a diagnosis is performed before the charging of the battery pack 100 is started. The problem described above can be solved by performing the second operational flow. In the second operational flow, when the battery pack 100 is connected to the charger 200, the control unit 105 in the battery pack 100 communicates start-of-charge information with the charger 200 (Step S501).

Next, the control unit 105 performs, on the charge relay 104 in an off state, a diagnosis of a short circuit abnormality (fusion) by use of a discharge current by a method similar to Step S408 in FIG. 4 (Step S502). When a short circuit abnormality (fusion) is detected as a result of the diagnosis in Step S502, an abnormality flag is set and reported to the user as in Step S410, and the operation of the diagnosis of an abnormality is terminated (not shown). When a short circuit abnormality (fusion) is not detected, the charge relay 104 is turned on after the diagnosis is completed (Step S503).

Next, the second MOSFET 102b is turned off (Step S504), and a diagnosis of a short circuit abnormality (fusion) in the second MOSFET 102b is performed by use of a discharge current by a method similar to Step S404 in FIG. 4 (Step S505). When a short circuit abnormality (fusion) is detected as a result of the diagnosis in Step S505, an abnormality flag is set and reported to the user in a similar way, and the operation of the diagnosis of an abnormality is terminated (not shown). When a short circuit abnormality (fusion) is not detected, the second MOSFET 102b is turned on after the diagnosis is completed (Step S506).

Then, a diagnosis of a short circuit abnormality (fusion) in the MOSFET 102a is performed by use of a charge current (Step S507). The diagnosis in Step S507 is the diagnosis performed on the MOSFET 102a in Steps S301 to S311 described in FIG. 3.

When the diagnosis is completed, all of the MOSFETs 102a and 102b and the charge relay 104 are in an on state and in a state in which charging can be started immediately. Thus, the control unit 105 immediately starts issuing a charge-current instruction to the charger 200 (Step S508). In response to a signal of the charge-current instruction, the charger 200 starts outputting a charge current to the battery pack 100 (Step S509).

If the diagnosis of a short circuit abnormality (fusion) before the charging is started is performed by the procedures in the second operational flow described above, the number of on/off switching controls of the first and second MOSFET 102a and 102b and the charge relay 104 is minimal, which results in efficiently diagnosing a short circuit abnormality (fusion) in these switch elements.

In the second operational flow described above, even if the order of performing the diagnosis of the first MOSFET 102a in Step S507 and the diagnosis of the second MOSFET 102b in Steps S504 to S506 is changed, the number of on/off switching controls for diagnosing a short circuit abnormality (fusion) in each switch element remains unchanged. Thus, the diagnosis in Step S507 may be performed between "TURN ON CHARGE RELAY" of Step S503 and "TURN OFF MOSFET 102b" of Step S504.

The diagnosis of a short circuit abnormality (fusion) according to the second operational flow described above is only performed before the charging of the battery pack 100 is started, and it is possible to diagnose, before the charging is started, a short circuit abnormality (fusion) that has occurred while a vehicle equipped with the battery pack 100 is moving, but it is not possible to detect a short circuit abnormality (fusion) that occurs during the charging before a next charging is started.

Figure 6:
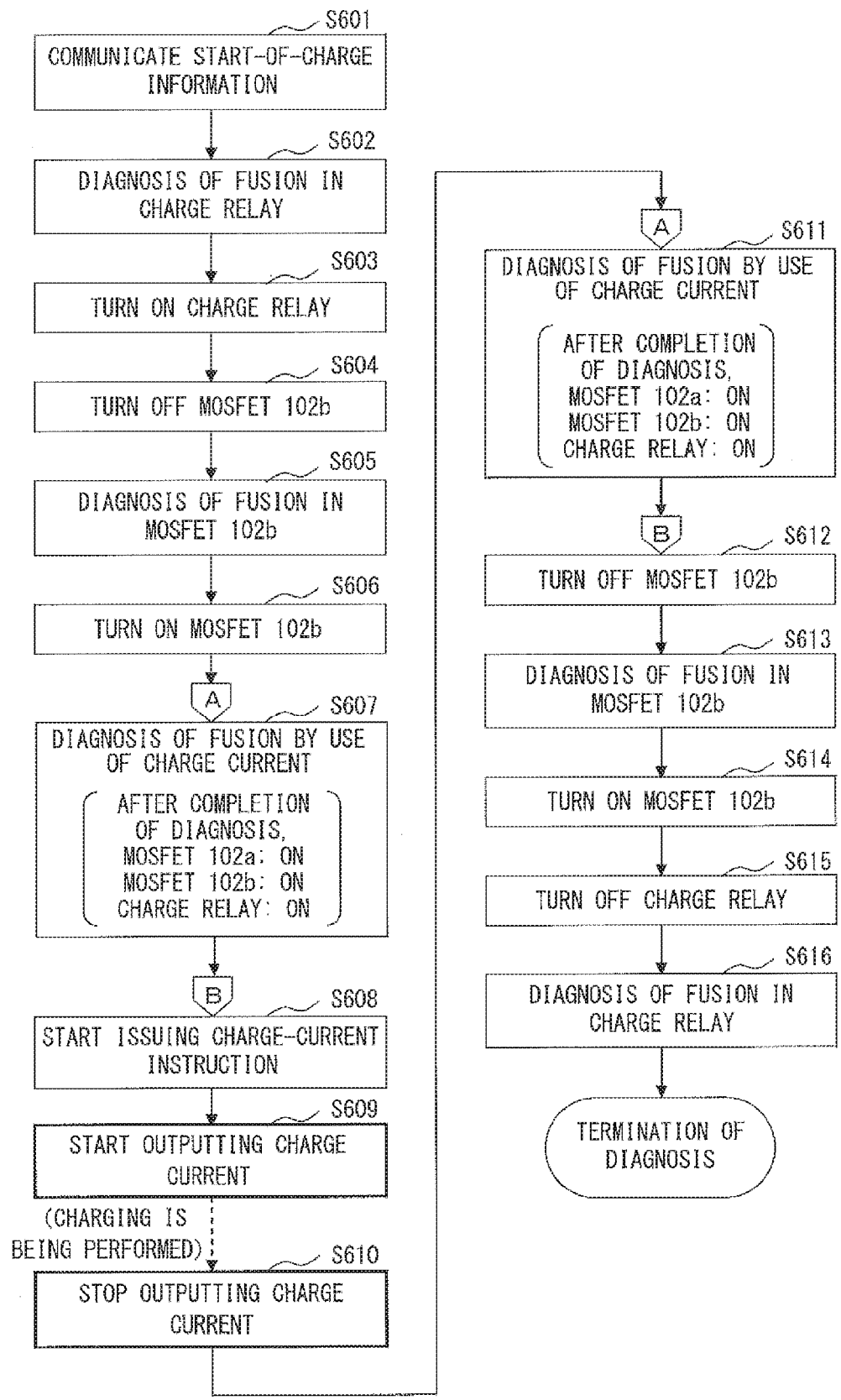
FIG. 6 is a third flowchart for performing a diagnosis of each switch element by use of a charge current and a discharge current.
Figure 7:
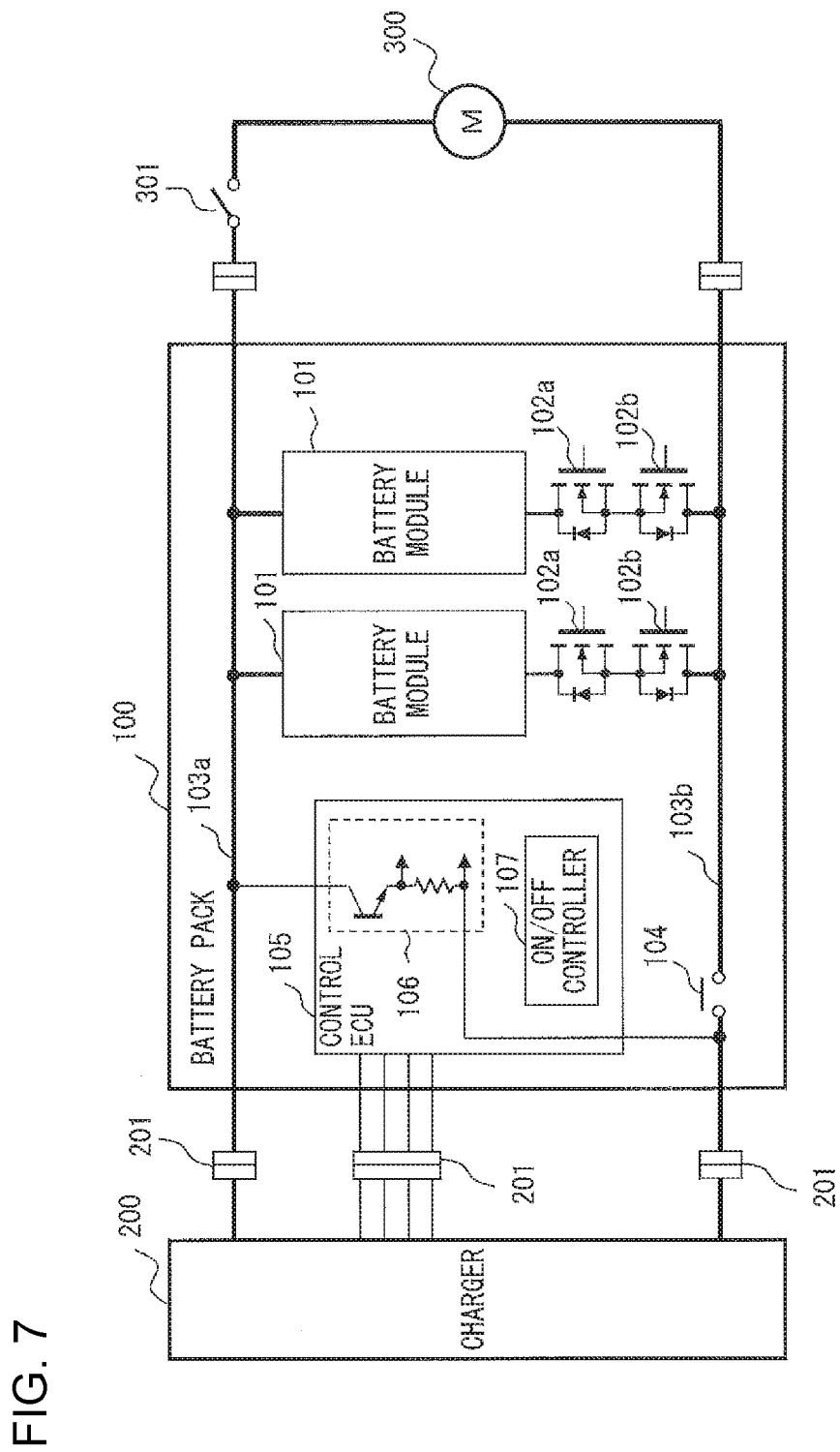
FIG. 7 illustrates an example of a battery pack used for diagnosing a short circuit abnormality in a MOSFET that causes a discharge current to flow out and a short circuit abnormality in a charge relay.

Thus, as illustrated in FIG. 6 as a third operational flow, a diagnosis of a short circuit abnormality (fusion) in each switch element is performed before the charging of the battery pack 100 is started and after the charging is completed. This permits solving of the problem.

In the third operational flow, as a diagnosis before the charging is started, diagnoses of a short circuit abnormality (fusion) in the first and second MOSFETs 102a and 102b and the charge relay 104 are performed in Steps S601 to S609 by procedures similar to Steps S501 to S509 illustrated in FIG. 5.

After the diagnosis before the charging is started is completed, the battery pack 100 starts to be charged by the charger 200 (Step S609), and when the charging is completed and the output of the charge current from the charger 200 is stopped (Step S610), then a diagnosis of a short circuit abnormality (fusion) after the charging is completed is performed.

As a diagnosis of a short circuit abnormality (fusion) after the charging is completed, a diagnosis of a short circuit abnormality (fusion) in each switch element is performed in Steps S611 to S616 by procedures similar to Steps S402 to S410 illustrated in FIG. 4. When a short circuit abnormality (fusion) is detected as a result of the diagnosis of the second MOSFET 102b in Step S613, an abnormality flag is set and reported to the user as in Step S410 in FIG. 4, and the operation of the diagnosis of an abnormality is terminated (not shown). When a short circuit abnormality (fusion) is not detected, the second MOSFET 102b is turned on after the diagnosis is completed (Step S613).

Further, when a short circuit abnormality (fusion) is detected as a result of the diagnosis of the charge relay 104 in Step S616, an abnormality flag is also set and reported to the user as in Step S410 in FIG. 4, and the operation of the diagnosis of an abnormality is terminated (not shown). When a short circuit abnormality (fusion) is not detected, the operation of the diagnosis of an abnormality is terminated at this point.

The order of performing the diagnosis of the first MOSFET 102a and the diagnosis of the second MOSFET 102b also may be changed in the third operational flow, but if a diagnosis of each switch element is performed in the order of the third operational flow, the number of on/off switching controls of each of the switch elements for performing a diagnosis is minimal, which results in efficiently diagnosing a short circuit abnormality (fusion) in these switch elements.

The embodiments of the present invention have been described above, but the present invention is not limited to the embodiments described above, and various modifications and alterations may be made thereto without departing from the spirit and scope of the invention.

For example, the on/off controls of the first and second MOSFETs 102a and 102b may be performed by a battery monitoring unit (not shown) in each battery module 101 instead of the on/off controller 107 in the control unit 105 common to each battery module 101.

Further, the start-of-charge instruction unit 108 and the short circuit abnormality diagnostic unit 109 may be included in the battery monitoring unit. Furthermore, the determination of whether a charge current is flowing may be performed by the charger 200 instead of the battery pack 100, and a diagnosis of an abnormality may be performed by the charger 200. Moreover, the charge relay 104 is not limited to a mechanical relay, and various types of switches may be applicable to it.

REFERENCE SIGNS LIST 100 battery pack
101 battery module
102a first MOSFET switch element
102b second MOSFET switch element
103a positive feed line
103b negative feed line
104 charge relay
105 control unit (control ECU)
106 discharging circuit
107 on/off controller
108 start-of-charge instruction unit
109 short circuit abnormality diagnostic unit
110 current sensor
200 charger
201 a charger-side connector
300 load
301 main switch

The invention claimed is:

1. An abnormality diagnostic device for diagnosing an abnormality in a MOSFET switch element, the abnormality diagnostic device comprising:

a current sensor detecting current that flows through a battery module;

a first MOSFET switch element that causes a charge current to flow into the battery module and is connected to the battery module in series;

a second MOSFET switch element that causes a discharge current to flow out of the battery module and is connected to the first MOSFET switch element and the battery module in series;

a charge relay that is provided in a current path through which a charge current flows from a charger to the battery module; and a control unit that turns off, after the charging of the battery module performed by the charger is completed, the first MOSFET switch element in a state in which the charge relay is on, transmits, to the charger, an instruction signal to start a charging operation, and determines, on the basis of an output signal of the current sensor, whether current is flowing through the first MOSFET switch element due to the charging operation of the charger, so as to diagnose a short circuit abnormality in the first MOSFET switch element on the basis of a result of the determination;

that turns off, after the charging is completed, the second MOSFET switch element in a state in which the charge relay is on, and determines whether a discharge current is flowing through the second MOSFET switch element, so as to diagnose a short circuit abnormality in the second MOSFET switch element; and that turns off, after the diagnoses of a short circuit abnormality in the first MOSFET switch element and a short circuit abnormality in the second MOSFET switch element are completed, the charge relay in a state in which the first MOSFET switch element and the second MOSFET switch element are on, and determines whether a discharge current is flowing through the charge relay, so as to diagnose a short circuit abnormality in the charge relay.

2. An abnormality diagnostic device for diagnosing an abnormality in a MOSFET switch element, the abnormality diagnostic device comprising:
 a current sensor detecting current that flows through a battery module;
 a first MOSFET switch element that causes a charge current to flow into the battery module and is connected to the battery module in series;
 a second MOSFET switch element that causes a discharge current to flow out of the battery module and is connected to the first MOSFET switch element and the battery module in series;
 a charge relay that is provided in a current path through which a charge current flows from a charger to the battery module; and
 a control unit
  that determines, before the charging of the battery module performed by the charger is started, whether a discharge current is flowing through the charge relay in a state in which the charge relay is off, so as to diagnose a short circuit abnormality in the charge relay;
  that turns off, after the diagnosis of a short circuit abnormality in the charge relay is completed and before the charging is started, the first MOSFET switch element in a state in which the charge relay is on, transmits, to the charger, an instruction signal to start a charging operation, determines, on the basis of an output signal of the current sensor, whether current is flowing through the first MOSFET switch element due to the charging operation of the charger, so as to diagnose a short circuit abnormality in the first MOSFET switch element on the basis of a result of the determination, and turns on, after the diagnosis, the first MOSFET switch element when a short circuit abnormality has not been detected; and
  that turns off, after the diagnosis of a short circuit abnormality in the charge relay is completed and before the charging is started, the second MOSFET switch element in a state in which the charge relay is on, determines whether a discharge current is flowing through the second MOSFET switch element, so as to diagnose a short circuit abnormality in the second MOSFET switch element, and turns on, after the diagnosis, the second MOSFET switch element when a short circuit abnormality has not been detected.

3. An abnormality diagnostic method for diagnosing an abnormality in a MOSFET switch element, wherein the diagnosis is performed with respect to a battery pack including a current sensor detecting current that flows through a battery module, a first MOSFET switch element that causes a charge current to flow into the battery module and is connected to the battery module in series, a second MOSFET switch element that causes a discharge current to flow out of the battery module and is connected to the first MOSFET switch element and the battery module in series, and a charge relay that is provided in a current path through which a charge current flows from a charger to the battery module, the abnormality diagnostic method comprising:

turning off, after the charging of the battery module performed by the charger is completed, the first MOSFET switch element in a state in which the charge relay is on, transmitting, to the charger, an instruction signal to start a charging operation, and determining, on the basis of an output signal of the current sensor, whether current is flowing through the first MOSFET switch element due to the charging operation of the charger, so as to diagnose a short circuit abnormality in the first MOSFET switch element on the basis of a result of the determination;
 turning off, after the charging is completed, the second MOSFET switch element in a state in which the charge relay is on, and determining whether a discharge current is flowing through the second MOSFET switch element, so as to diagnose a short circuit abnormality in the second MOSFET switch element; and
 turning off, after the diagnoses of a short circuit abnormality in the first MOSFET switch element and a short circuit abnormality in the second MOSFET switch element are completed, the charge relay in a state in which the first MOSFET switch element and the second MOSFET switch element are on, and determining whether a discharge current is flowing through the charge relay, so as to diagnose a short circuit abnormality in the charge relay.

4. An abnormality diagnostic method for diagnosing an abnormality in a MOSFET switch element, wherein the diagnosis is performed with respect to a battery pack including a current sensor detecting current that flows through a battery module, a first MOSFET switch element that causes a charge current to flow into the battery module and is connected to the battery module in series, a second MOSFET switch element that causes a discharge current to flow out of the battery module and is connected to the first MOSFET switch element and the battery module in series, and a charge relay that is provided in a current path through which a charge current flows from a charger to the battery module, the abnormality diagnostic method comprising:
 determining, before the charging of the battery module performed by the charger is started, whether a discharge current is flowing through the charge relay in a state in which the charge relay is off, so as to diagnose a short circuit abnormality in the charge relay;
 turning off, after the diagnosis of a short circuit abnormality in the charge relay is completed and before the charging is started, the first MOSFET switch element in a state in which the charge relay is on, transmitting, to the charger, an instruction signal to start a charging operation, determining, on the basis of an output signal of the current sensor, whether current is flowing through the first MOSFET switch element due to the charging operation of the charger, so as to diagnose a short circuit abnormality in the first MOSFET switch element on the basis of a result of the determination, and turning on, after the diagnosis, the first MOSFET switch element when a short circuit abnormality has not been detected; and
 turning off, after the diagnosis of a short circuit abnormality in the charge relay is completed and before the charging is started, the second MOSFET switch element in a state in which the charge relay is on, determining whether a discharge current is flowing through the second MOSFET switch element, so as to diagnose a short circuit abnormality in the second MOSFET switch element, and turning on, after the diagnosis, the second MOSFET switch element when a short circuit abnormality has not been detected.

* * * * *